United States Patent [19]
Futagawa et al.

[11] 4,087,861
[45] May 2, 1978

[54] CALCULATOR

[75] Inventors: Yoshikiyo Futagawa; Katsumi Kuriya, both of Shiojiri, Japan

[73] Assignees: Shinshu Seiki Kabushiki Kaisha, Suwa; Kabushiki Kaisha Suwa Seikosha, Tokyo, both of Japan

[21] Appl. No.: 749,551

[22] Filed: Dec. 10, 1976

[30] Foreign Application Priority Data

Dec. 10, 1975 Japan .............................. 50-146979

[51] Int. Cl.² .......................... G06F 7/48; G06F 15/02
[52] U.S. Cl. ..................... 364/709; 364/710; 364/712
[58] Field of Search ............................. 235/152, 156; 340/365 R, 365 S, 366 R; 350/160 LC

[56] References Cited

U.S. PATENT DOCUMENTS

| | | | |
|---|---|---|---|
| 3,715,746 | 2/1973 | Hatano | 340/365 S |
| 3,781,852 | 12/1973 | White | 340/324 R |
| 3,834,616 | 9/1974 | Washizuka et al. | 340/365 S X |
| 3,950,743 | 4/1976 | Hatano et al. | 340/365 R X |
| 3,991,306 | 11/1976 | Raymond, Jr. | 235/156 |
| 3,999,180 | 12/1976 | Hickman | 350/160 LC X |

*Primary Examiner*—Jerry Smith
*Attorney, Agent, or Firm*—Blum, Moscovitz, Friedman & Kaplan

[57] ABSTRACT

A calculator is provided having a display cell formed from a passive display material, regions of which are rendered visible by segmented electrodes. The display cell is driven by the application of selected driving signals to respective segment electrodes along display-driving lines coupled to said segment electrodes. A large-scale integrated circuit includes circuitry for producing said driving signals for application to said display-driving lines and calculator circuitry. A keyboard device is provided having an output coupled to said large-scale integrated circuit and a plurality of inputs coupled to selected of said display-driving lines, said large-scale integrated circuit including circuitry for selectively applying keyboard input signals to said selected of said display-driving lines for application to said keyboard inputs when said keyboard is utilized.

8 Claims, 30 Drawing Figures

CALCULATOR

BACKGROUND OF THE INVENTION

This invention relates to electronic calculators having digital readouts, wherein said readouts are in the form of a display cell incorporating an electro-optically passive material such as liquid crystal material. Specifically, this invention relates to such electronic calculators incorporating large-scale integrated circuits for driving the display cell and performing calculating functions.

In recent years, the use of display cells incorporating passive elements, as opposed to electro-optically emissive elements such as light-emitting diodes, has rapidly increased in timepieces, calculators, measuring apparatus and the like. Such increased use results from the low power consumption characteristic of such passive elements. Passive display elements are characterized by the selective rendering of regions of the display cell visually distinguishable from adjacent regions. The selected regions are generally shaped as a character (based, by way of example, on a seven-bar display for numerics). A number of approaches can be used to render the selected region visually distinguishable, including selectively rendering regions of the passive element light-transparent, with the region being rendered visible through reflection or light transmission. Electric fields or current applied to the passive elements can change the optical light rotary-power characteristic of a region to render the region transparent or can cause light-scattering in the region by applying an oscillatory motion such as the Brownian movement to the crystal. Passive elements, as used herein, are not limited to liquid crystal materials but include other passive materials, such as, by way of example, substances which apply the double refractivity caused by the electric field of a ferroelectric (Pockels Effect or Kerr Effect). By way of example, the calculator depicted herein incorporates a liquid crystal display cell and is adapted for use where the supply voltage is low, namely, 1.5 volts to 30 volts.

Specifically with regard to liquid crystal materials, there are two types of driving characteristic, namely, the Field Effect Mode (FEM), wherein the orientation of the liquid crystal molecules is controlled in order to obtain the rotary-power optical activity by the field effect, and the Dynamic Scattering Mode (DSM), wherein the complicated motion of the liquid crystal molecules is caused by the applied current. FEM liquid crystal materials have extremely excellent low-power consumption characteristics on the order of $10\mu W$ or less in the case of a digit display of about eight figures. Such liquid crystal displays produce a wristwatch which can be driven by a battery and which is characterized by a life of one year or more.

However, liquid crystal materials do not have the diode characteristic of a display cell made of active elements such as light-emitting diodes and fluorescent display tubes, so that the duty factor for dynamic driving is large and many controlling wires are required. The duty factor of a passive element is a quarter to at most one-tenth of the duty factor of an active element. For this reason, the application of liquid crystal display cells to calculators causes an economic loss because the input and output terminals of the large-scale integrated circuit which contains the bulk of the calculator circuitry increase in number.

This results in an increase in the area of the silicon wafer defining the large-scale integrated circuit, modification of standard tools for assembling such large-scale integrated circuits and increased inspection time, thereby resulting in increased costs of production. In other words, the marked advantages of liquid crystal material are nullified by the increased costs necessitated by the large-scale integrated circuits of increased size. This produces the anomalous result that while a liquid crystal display for a calculator enables the provision of a battery power source having a long life, the resulting calculator is inferior to a calculator using active elements because of the price thereof. By using the display-driving lines as input lines for the keyboard, the foregoing deficiencies are avoided.

SUMMARY OF THE INVENTION

Generally speaking, in accordance with the invention, an electronic calculator is provided having display-cell means incorporating a passive display material and a plurality of segment electrodes positioned on opposed sides of said passive display material for defining digits of display upon the selective application of driving signals to selected of said segment electrodes; large-scale integrated circuit means for producing said driving signals; display-driving lines operatively coupling said large-scale integrated circuit means and said segment electrodes for transmitting said driving signals and a keyboard device having an output operatively coupled to said large-scale integrated circuit means and a plurality of inputs respectively connected to a corresponding selected plurality of said display-driving lines, said large-scale integrated circuit means including calculator circuit means and keyboard-actuation circuit means for applying keyboard input signals to said display-driving lines in response to the actuation of said keyboard. Accordingly, it is an object of the invention to provide a relatively inexpensive calculator which can be produced utilizing a large-scale integrated circuit of conventional terminal configuration in combination with a display cell incorporating a passive display material such as liquid crystal material.

Another object of the invention is to provide a relatively inexpensive electronic calculator of being driven by a battery.

Still other objects and advantages of the invention will in part be obvious and will in part be apparent from the specification and drawings.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1b is a top plan view of the display cell of FIG. 1a;

DESCRIPTION OF THE PREFERRED EMBODIMENTS

Figure 1A:
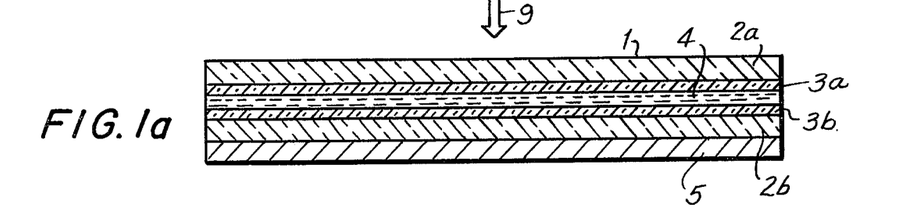
FIG. 1a is a schematic cross-sectional view of a display cell formed from electro-optically passive material.
Figure 1B:
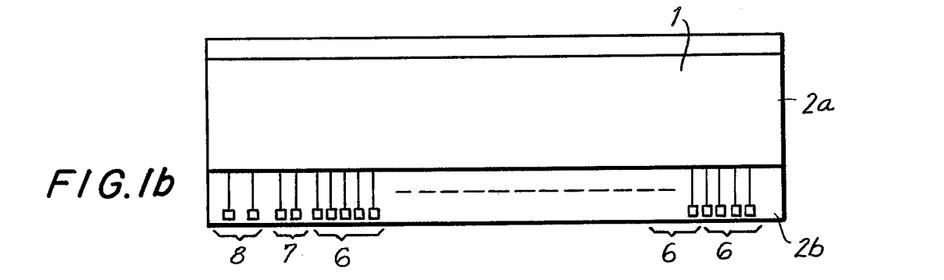
Figure 2A:
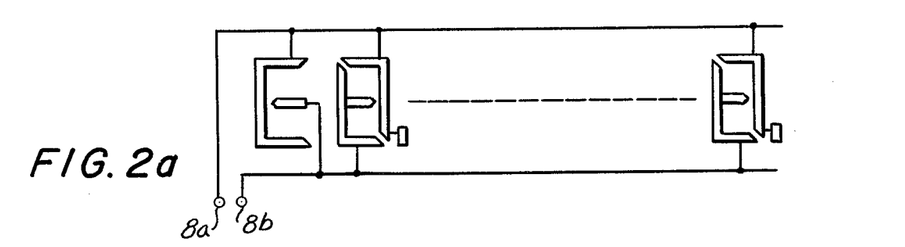
FIG. 2a depicts the arrangement of electrodes on one plate of the display cell of FIGS. 1a and 1b.
Figure 2B:
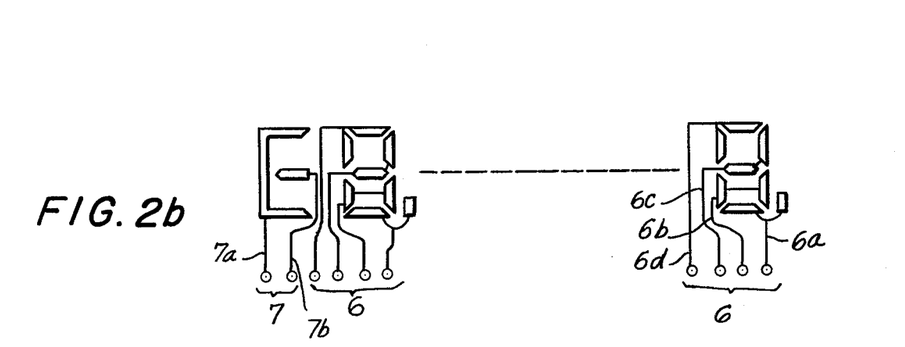
FIG. 2b depicts the arrangement of electrodes on the other plate of the display cell of FIGS. 1a and 1b.

Referring now to FIGS. 1a and 1b, the display cell 1 depicted consists of a pair of spaced transparent plates 2a and 2b, each bearing an array of segmented transparent electrodes 3a and 3b respectively. Retained between said plates and transparent electrodes is a layer of liquid crystal material 4. A mirror 5 is provided on the outer surface of plate 2b to define a reflective device, the light being applied to the display in the direction of arrow 9. As more particularly depicted in FIGS. 2a and 2b, the segmented electrodes define a liquid crystal display having a duty factor of one-half, and provided with eight digits of numerical display and the symbols for error "E" and negative "—". Each numeric digit is generally in the shape of the number 8 and also includes a decimal-point system. Electrodes 3a are as depicted in FIG. 2a and are characterized as the common electrodes 8a and 8b. Common electrode driving wire 8a is connected to the upper and lower horizontal bars and the vertical bar of the letter E, and the upper horizontal and right-most vertical bars and the decimal point of each numeric digit. Common electrode driving wire 8b is connected to the middle horizontal bar of the letter E (—) as well as the left-most vertical bar and the middle and lower horizontal bars of each digit. The electrodes 3b are arranged as depicted in FIG. 2b, each of the numeric digits being represented by the seven bars of a seven-bar display plus a decimal point. Four segment-driving wires 6 are associated with each digit, each segment-driving wire being associated with two of the segments of the numeric digit. Thus, the upper horizontal and left upper vertical segments are joined together to the first segment-driving wire 6d, the middle horizontal and right upper vertical segments are joined together to the second segment-driving wire 6c, the left and right lower vertical segments are joined together to the third segment-driving wire 6b, and the lower horizontal and decimal-point segments are joined together to the fourth segment-driving wire 6a. In like manner, two segment-driving wires 7 are associated with the error and minus sign symbol, the first segment-driving wire 7a being connected to the commonly connected upper and lower horizontal and vertical bars and the second segment-driving wire 7b being connected to the middle horizontal bar (—). As more particularly shown in FIG. 1b, the various segment-driving wires 6, 7 and 8 are taken out to pads on a portion of plate 2b which extends beyond plate 2a for this purpose to define the input terminals to the driving cell 1. Where a FEM-type liquid crystal material is utilized, one or two polarizing plates are positioned on opposed sides of the liquid crystal material. All together, 36 output terminals are required to drive the liquid crystal display cell 1. In the case of a light-emitting diode display cell, only 17 input terminals are required, highlighting the defect which characterizes the liquid crystal display cell.

Figure 3:
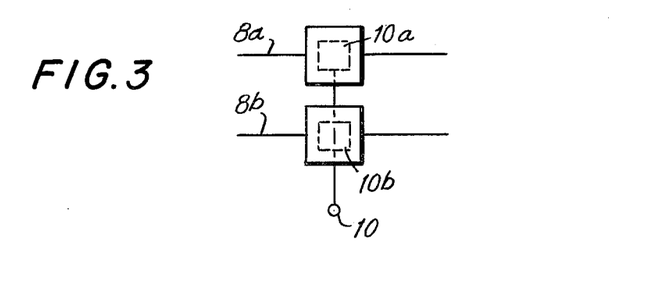
FIG. 3 is a schematic representation illustrating the method of driving a region of the display cell of FIGS. 1a and 1b.

As illustrated schematically in FIG. 3, each of the four segment-driving wires 6 (here identified by reference numeral 10) is provided with two segment electrodes (10a and 10b), each positioned in overlapping relation with one of the electrodes of one of the common electrode driving wires 8a and 8b. In this manner, the application of a voltage of a sufficient level between lines 10 and 8a serves to render visually distinguishable the region defined by electrode 10a, while an energizing voltage of sufficient level between lines 10 and 8b serves to render visually distinguishable the region defined by electrode 10b.

Figure 4A:
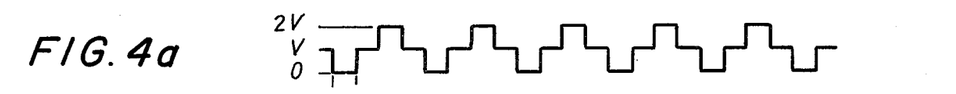
FIGS. 4a through 4g are waveform diagrams illustrative of the various waveforms utilized to drive the display cell of FIGS. 1a and 1b.
Figure 4B:
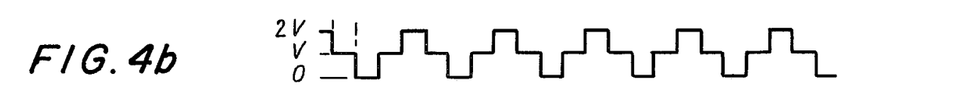
Figure 4C:
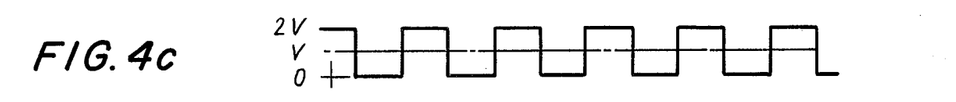
Figure 4D:
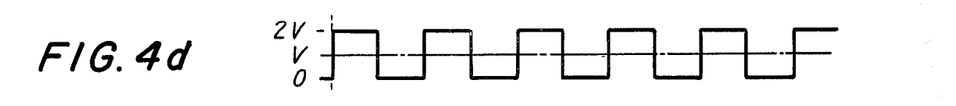
Figure 4E:
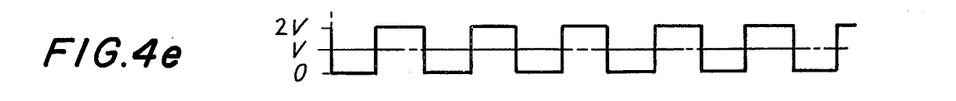

The driving method is more particularly illustrated by the waveform diagrams of FIGS. 4a through 4g, wherein V equals the unit voltage. The waveforms depicted in FIGS. 4a and 4b are applied respectively to the common electrode wire 8a and 8b. FIGS. 4c, 4d and 4e show examples of waveform voltages which may be applied to segment-driving wire 10 (segment-driving wires 6 and 7 of FIG. 2b). Waveform 4c illustrates the waveform in the case of lighting character segment 10a, waveform 4d shows the waveform in the case of lighting character segments 10a and 10b, while waveform 4e shows the case where neither segment 10a nor segment 10b is rendered visually distinguishable.

As is apparent from a consideration of FIG. 4, the maximum potential difference between the segmented electrodes on the two plates is 2V, as shown by waveform 4f, which represents the voltage difference between selected segment electrodes the regions of which are rendered visually distinguishable. Where the potential difference has the maximum value V, as shown by waveform 4g, the segment electrodes are not selected and are not rendered visually distinguishable. The liquid crystal display cell has the property that a region thereof will be rendered visually distinguishable if the potential difference thereacross equals at least 2V but will not be rendered visually distinguishable if the voltage difference is about V. However, whether a liquid crystal material is actuated so as to be rendered visually distinguishable is determined by the effective voltage of waveforms 4f and 4g and not by the voltages 2V and V themselves. This is because the liquid crystal material is partially actuated by even a low voltage. In other words, the diode characteristic and threshold voltages for rendering liquid crystal material regions visually distinguishable are not sharp. Further, the threshold voltage moves depending on the material of the liquid crystal, the temperature and the driving duty factor.

Figure 4F:
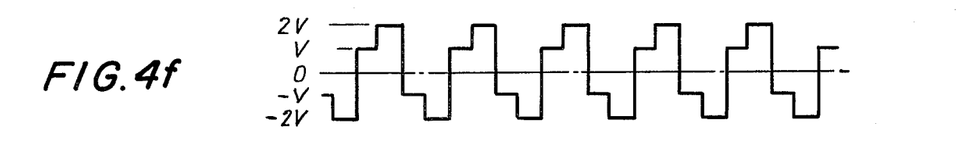
Figure 4G:
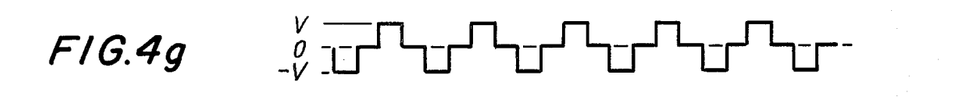

The effective voltages of the waveforms of FIGS. 4f and 4g are $\sqrt{5}/2$ V and $\sqrt{\frac{1}{2}}$ V, respectively. The voltage ratio of the actuated to the nonactuated states is equal to $\sqrt{5}$. In the embodiment of FIG. 4, the duty factor is $\frac{1}{2}$. In an embodiment wherein the duty factor is $\frac{1}{4}$, the voltage ratio of the actuated to the nonactuated states would be $\sqrt{7}/3$, so that the difference between the respective voltages is relatively small. This results in difficulty in distinguishing between the actuated and nonactuated states due to the appearance of a half-tone. In order to improve the foregoing, the actuation threshold voltage is made 3V and the nonactuating voltage is made V. In this approach, if the duty factor is $\frac{1}{4}$, the ratio of the actuating voltage to the nonactuating voltage is $\sqrt{11}/4$. The latter value represents the vicinity of the limit of actual application. The foregoing difficulty can be avoided by driving the liquid crystal display in a static rather than the dynamic manner discussed in connection with the waveforms of FIGS. 4a through 4g. However, the static driving arrangement requires 67 input terminals for each display cell, and for this reason, the use of the static driving method is difficult to achieve in an economical calculator. For this reason, the driving duty factor of a display cell using electro-optically passive materials such as liquid crystal materials is generally set at $\frac{1}{4}$, at the most.

Figure 5:
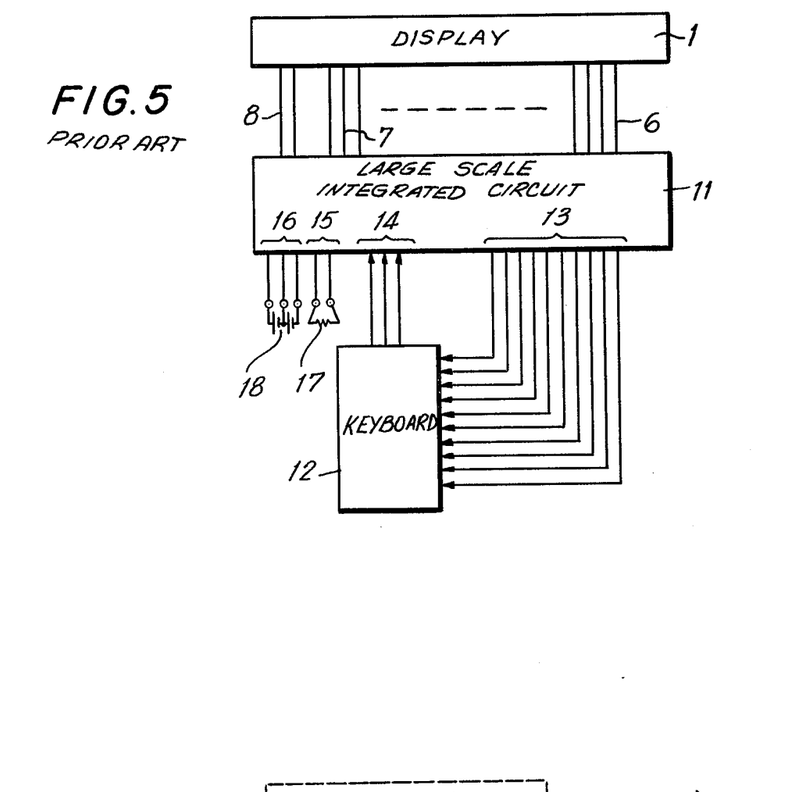
FIG. 5 is a block diagram of a conventional calculator incorporating a display cell formed from passive elements.
Figure 7:
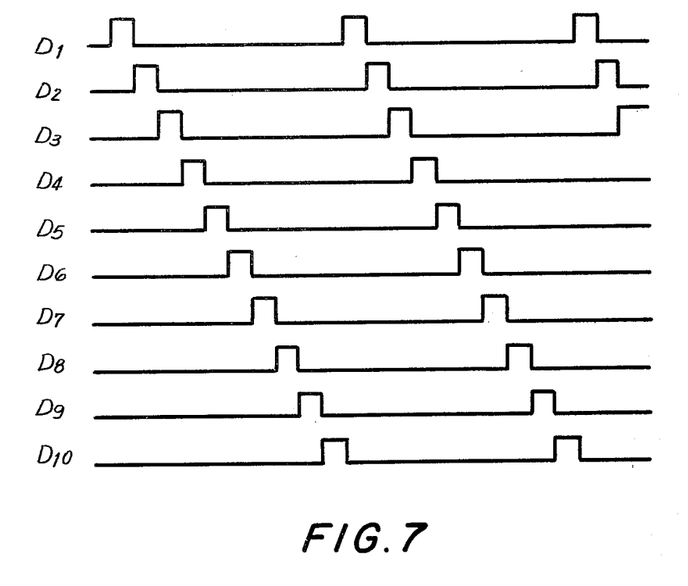
FIG. 7 is a waveform diagram depicting the figure signals utilized in the circuit of FIG. 5.

Referring now to FIG. 5, a conventional calculator structure utilizing a display cell formed from passive elements is depicted. The display cell is driven through segment-driving lines 6, 7 and 8 by a large-scale integrated circuit 11. Large-scale integrated circuit 11 includes the conventional calculator and display-driving circuitry well known in the art. The calculator circuitry is driven from a keyboard 12 through keyboard output terminals 14. The input signals to the keyboard for producing the coded outputs at terminals 14 are applied from the large-scale integrated circuit 11 along input lines 13, ten such input lines being illustrated. The signals on lines 13 are, by way of illustration, depicted in FIG. 7, each of the ten figure pulses being represented by a signal $D_1, D_2 ..., D_{10}$. Each of the ten pulse signals has successively different phases. The input signal from line 13 selected by a key on keyboard 12 is transmitted back along the output line 14 associated with such key. Terminals 15 of the large-scale integrated circuit 11 are for connection to an external frequency-adjusting mechanism for adjusting the frequency of oscillation of the internal clock generator within the large-scale integrated circuit. Resistor 17 is coupled to terminals 15 for this purpose. In place of resistor 17, either a capacitor or the combination of a resistor and capacitor may be provided for selecting a specific time constant for adjusting the oscillation frequency of the clock generator. While the resistor or capacitor may be formed within the large-scale integrated circuit, the values thereof are so large and the oscillation frequencies vary to such a great extent that it is usual to provide an external adjusting terminal as illustrated by reference numerals 15 of FIG. 5. Terminals 16 of the large-scale integrated circuit are power input terminals coupled to power source 18, consisting of a center-tapped battery power source. The center-tap provides an intermediate voltage utilized for forming the driving waveforms of the common electrode wires as illustrated by the waveforms of FIGS. 4a and 4b. The number of input and output terminals of the large-scale integrated circuit 11 of FIG. 5 is 54, a relatively large value.

Figure 8:
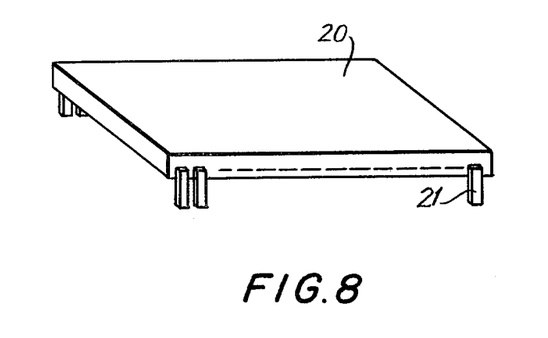
FIG. 8 is a schematic view of a large-scale integrated circuit.

Referring to FIG. 8, the large-scale integrated circuit 20 depicted therein is provided with a plurality of output terminals 21. In a conventional large-scale integrated circuit, the number of output terminals 21 is 14, 16, 18, 24, 28, 36 or 42. Most manufacturing equipment, tooling and the like are designed to accommodate one of the standard terminal arrangements. For this reason, manufacture of a calculator becomes expensive if the calculator incorporates a large-scale integrated circuit having more than 42 output terminals.

Figure 6:
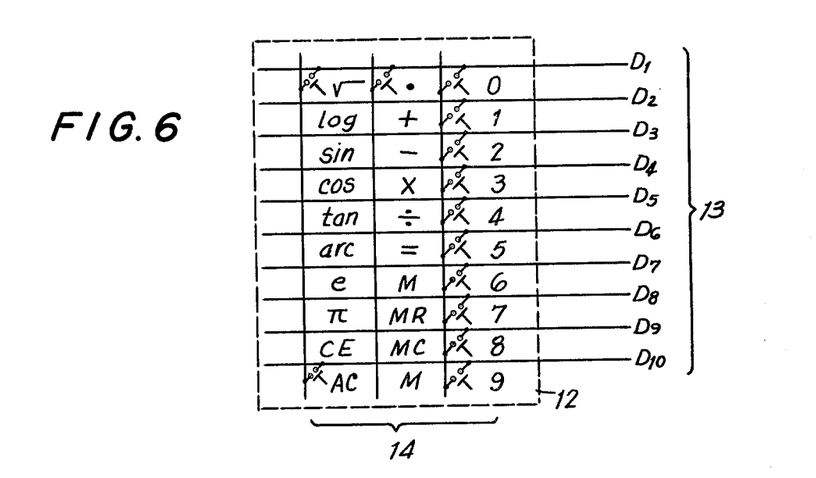
FIG. 6 is a schematic diagram of the wiring of a keyboard of the type depicted in FIG. 5.

Referring to FIG. 6, the internal construction of a keyboard 12 is depicted. In this embodiment of keyboard 12, input terminals 13 are arranged in an array extending horizontally and intersecting output terminals 14 which are arranged vertically. At the intersections of each input and output terminal lead, a switch representative of a particular input is provided. In the embodiment illustrated, 10 × 3 types of inputs are available when digit keys and operation order keys are provided. In the case of a miniature pocket calculator, about 22 types of inputs are required. Accordingly, if the calculator has the capability of providing 30 types of inputs, it is sufficient to perform the required function. The construction of such a keyboard is well known in the art.

Where light-emitting diodes having a large duty factor are utilized, the number of common electrode wires is 9 in the digit display, one common electrode being provided for each digit. The common electrode wires receive signals equivalent to the pulses illustrated in the waveforms of FIG. 7, sequentially actuating each of the digits. For this reason, the common electrode wires 8 of the light emitting diode arrangement and the input terminals of keyboard 12 can be commonly connected, thereby reducing the number of input and output terminals of the large scale integrated circuit 11 as compared with the arrangement of FIG. 5.

On the other hand, in the embodiment of FIG. 4 wherein the passive display cell is used, only two common electrode wires are provided. Further, an alternating voltage is applied so that it is difficult to use the common electrodes as inputs to the keyboard. Accordingly, in the calculator according to the invention, 15 segment driving wires 6 among the 34 provided, and not the common electrode wires 8, are selected to be coupled to the input terminals of keyboard 12 as more particularly depicted in FIG. 9, like reference numerals being applied to like elements. Specifically, the 15 selected display driving lines 6 are coupled through lines 23 to the corresponding inputs of keyboard 12, keyboard 12, in this embodiment, having only two output lines 24. Even in this construction, 15 × 2 = 30 types of inputs can be performed, the equivalent of the inputs of the arrangement of FIG. 5. Large-scale integrated circuit 22 in accordance with the invention has only 42 input and output terminals and accordingly, can be assembled on conventional machinery at normal cost. It is also noted that the number of power source terminals coupled to power source 18 is reduced to two by removing the center tap in an arrangement which will be more particularly described below. In the alternative, the intermediate potential may be tapped from power source 18 and applied to the large-scale integrated circuit 22 through a resistor and common electrode wire 8.

Figure 9:
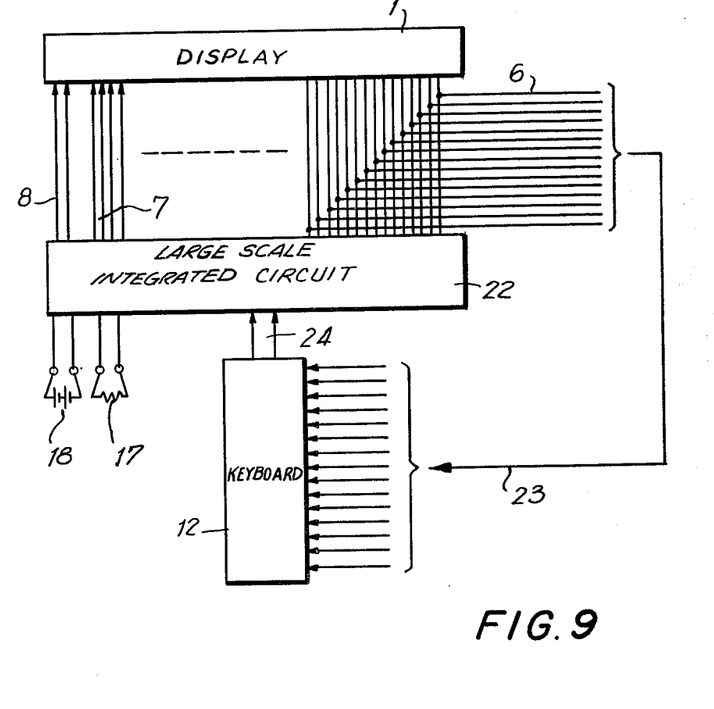
FIG. 9 is a block diagram view of the calculator in accordance with the invention.
Figure 10:
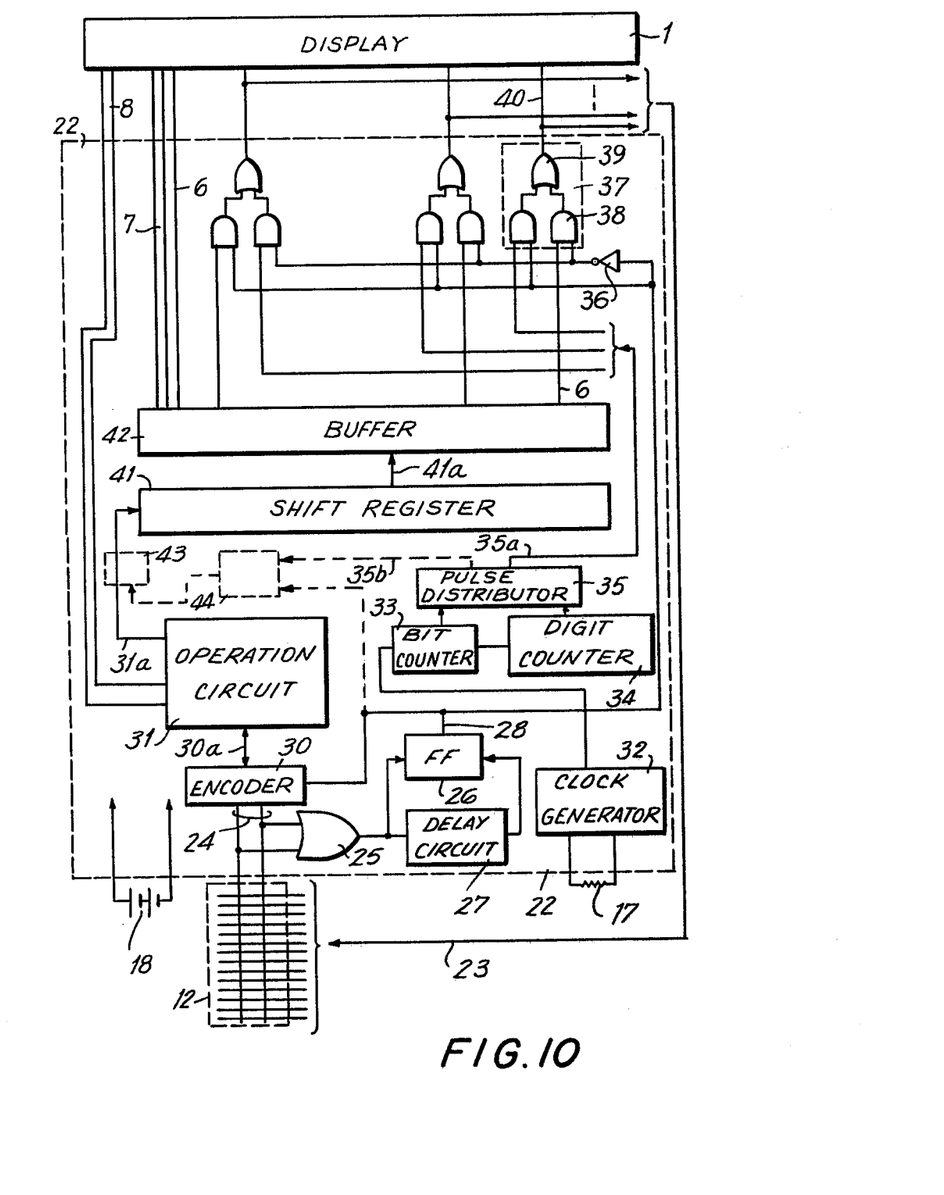
FIG. 10 is a more detailed block diagram of the circuit of FIG. 9.

Referring to FIG. 10, a more detailed block diagram of the calculator of FIG. 9 is depicted, like reference numerals being applied to like elements. The circuit of FIG. 10 incorporates keyboard actuation circuitry for detecting the actuation of the keyboard and applying the keyboard input signal to display driving line 6 in place of the display driving signal. Specifically, the two output lines 24 of keyboard 12 are coupled as the inputs to OR gate 25 which detects the presence of an output signal at either of the two output terminals. The output of OR gate 25 is applied as a setting signal to flip-flop 26 to produce an output signal at output 28 of said flip-flop. The output of OR gate 25 is also applied to delay circuit 27 which resets flip-flop 26 after a predetermined period of time to set the circuit to await the next output signal from the keyboard. The circuit of FIG. 10 would be provided with means for insuring that each continuous push of a key on the keyboard is regarded as a single command, circuitry which is not shown. The signal on lines 24 is applied to encoder 30 which is enabled by the output 28 of flip-flop 26 to detect the coded input signal transmitted to lines 24 for the purposes of transmitting a command to operation circuit 31 along line 30a. Operation circuit 31 includes the calculator circuits, memory circuits and the like formng a part of a conventional calculator. Operation circuit 31 transmits driving signals to common electrode wires 8 of display cell 1 and the data signal for driving the segments of the display to shift register 41 through line 31a. Buffer 42 receives the contents of the shift register after the full word is stored in such shift register. The contents of the shift register is transmitted in parallel along lines 41a to buffer 42. The outputs of buffer 42 are applied to the respective display driving lines 6 and 7 to effect a visual display for actuation of display cell 1. In this manner, the contents of the registers and the results of the operation of operation circuit 31 are displayed at display cell 1.

A clock generator 32 is coupled to resistor 17 for the frequency regulation thereof and is further coupled to a bit counter 33 corresponding to one figure of a decimal system. The four terminals of the bit counter transmit timing outputs in four bits expressed in the 1 - 2 - 4 - 8 binary coded system. The bit counter also drives a digit counter 34 which generates digital pulses corresponding to tens digits as more particularly illustrated in FIG. 7. In effect, the output of clock generator 32 is divided by 4 and that output is counted by the digit counter 34. Pulse distributor 35 selects fifteen output pulses from the 4 × 10 = 40 types of available signals obtained by combining the outputs of counters 33 and 34 and transmits the fifteen selected signals to gate blocks 37 through fifteen output leads shown schematically by lead 35a. If counter 34 is formed so that fifteen types of outputs are automatically produced, pulse distributor 35 is unnecessary, but the operation speed is reduced by one-half.

Each gate block 37 includes two AND gates 38, and an OR gate 39 connected to receive as its input the outputs of said AND gates. There are fifteen gate blocks, one corresponding to each of the display driving lines selected to provide inputs to the keyboard 12 while also serving as inputs to segments of the display cell 1.

One of AND gates 38 has at its inputs the output signal 28 of flip-flop 26 applied to an inverter 36 and a display driving line 6 coupled with an output to buffer 42 for transmitting a data signal. The other of AND gates 38 of each gate block 37 has as one of its inputs the output 28 of flip-flop 26 and one of the fifteen outputs from pulse distributor 35 along one of the lines 35a. When flip-flop 26 is set, by detecting the actuation of a key, fifteen pulses of different phases are transmitted through gate blocks 37 and applied along lines 40 to input lines 23 of keyboard 12 for transmission to the encoder by output lines 24, the encoder being set during this period by the output signal 28 of flip-flop 26. The detected command or order as determined by the actuated key is transmitted by encoder 30 to the operation circuit and therefore, due to the operation of delay circuit 27, flip-flop 28 is reset to disable the encoder and to set the block gate 39 so as to transmit the contents of buffer 42 to display cell 1.

An alternate embodiment for changing the function of segment driving wires 6 is illustrated in the dashed boxes 43 and 44 and associated leads of FIG. 10, in which embodiment gate blocks 37 may be eliminated. In this alternate embodiment, gate 43 selectively prohibits the segment driving signals from being transmitted from operation circuit 31 along line 31a to the shift register and causes the shift register to release pulses successively regularly to the segment driving wires 6 of the buffer 42. Control gate 44 controls the operation of gate 43. The input signals of control gate 44 are the pulse group signals having a fixed timing from pulse generator 35 actuated by the output signal 28 of flip-flop 26, such signals being transmitted along line 35b. In other words, upon detection of a key actuation, the output of the operation circuit 31a is disabled by gate 43 and suitable pulse signals are applied to shift register 41 for application to buffer 42 through the operation of pulse distributor 35 and control gate 44.

Figures 11A, 11B, 11C:
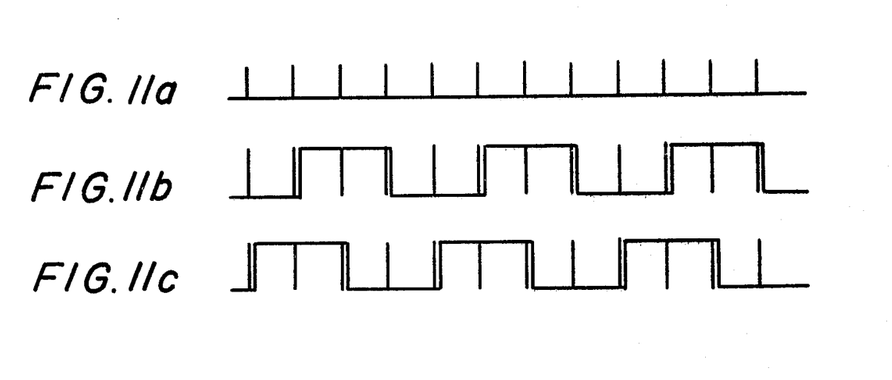
FIGS. 11a, 11b and 11c are waveform diagrams illustrating the pulse signals utilized in one embodiment of the calculator in accordance with the invention.

In the embodiment of FIG. 10, the initial actuation of a key of keyboard 12 is detected by detecting the segment driving signal of FIGS. 4c, 4d or 4e, admitted to outputs 24. This arrangement has the defect that the detecting time is long because of the slow period of the segment driving signals, such periods being on the order of 10ms - 30ms. This defect is avoided by utilizing the pulse scheme illustrated in FIGS. 11a, 11b and 11c. The waveform of FIG. 11a represents a series of pulses of a sufficiently short period to insure a proper detecting time, the pulses having an extremely narrow width. Such pulses are superimposed on the segment driving signal as illustrated by FIGS. 11b and 11c. The pulses of signal 11a do not influence the display quality of the liquid crystal cell by reason of their narrow width. A conventional gating circuit can be utilized to combine the segment driving signals with the keyboard protecting signals of FIG. 11a, as, by way of example, a gating circuit similar to that of gate block 37. With this construction, the condition of keyboard 12 is readily detected at an early time.

Figure 12:
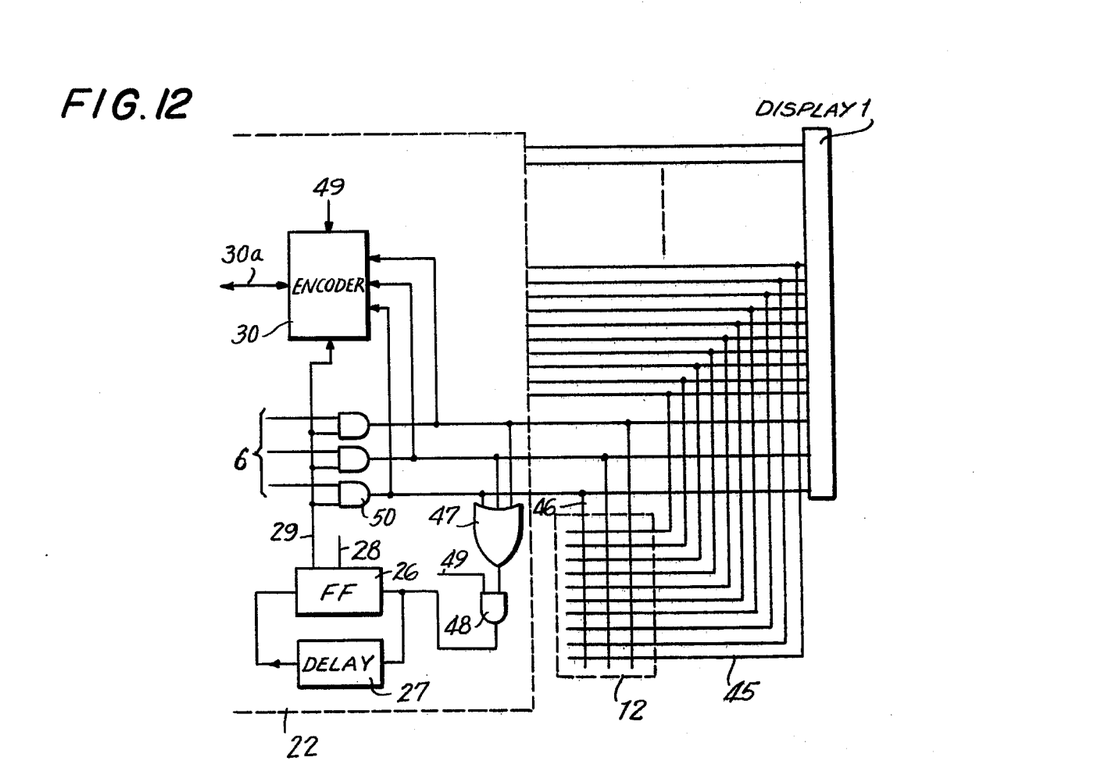
FIG. 12 is a partial block diagram of another embodiment of the calculator in accordance with the invention.

Referring now to FIG. 12, still another embodiment of the calculator in accordance with the instant invention is depicted. In the embodiment of FIG. 12, the segment driving wires 6 also serve as the output terminal 24 of keyboard 12, thereby further decreasing the input and output terminals of the large-scale integrated circuit 22 by a further two. In the embodiment of FIG. 12, ten selected segment driving wires 6 are coupled through input leads 45 to the inputs of keyboard 12. In this embodiment three outputs are provided for keyboard 12, each coupled to one segment driving wire 6. OR gate 47 is connected so as to receive as inputs the signal on the three display driving lines 6 coupled to the outputs 46 of keyboard 12. A scanning pulse which corresponds to waveform of 11a is applied at line 49 as one input to AND gate 48, the other input being the output of OR gate 47. AND gate 48 is provided for distinguishing the signal representative of the actuation of a key of the keyboard from the normal signals present on the selected display driving lines 6. The signal applied to the display driving lines 6 coupled to input lines 45 should take the form of the signals of FIGS. 11b and 11c so as to provide an actuation signal for setting flip-flop 26. When flip-flop 26 is set, an output signal 28 is produced which functions in the manner more particularly described in connection with FIG. 10. Flip-flop 26 is also provided with a "not" output which is provided as one input to AND gate 50, the other input of each of the AND gates being the display driving line 6 associated with the three output lines 46 of keyboard 12. The "not" signal 29 of flip-flop 26 is also applied to enable encoder 30. During normal operation, the segment driving pulse is passed through AND gates 50. When a signal is detected by OR gate 47 and AND gate 48 to set flip-flop 28, AND gates 50 are cut off, suitable coded signals are applied along lines 45 in the manner described in connection with FIG. 10 and the encoder 30 is enabled to transmit the coded signal representative of the actuated key to the operation circuit 31 along line 30a. One defect in the foregoing arrangement is that if a key is continuously pushed, segment driving signals cannot be transmitted to the display. In both of the foregoing embodiments, when a key of the keyboard is pushed, distinguishable pulses are thereafter transmitted to selected segment driving wires 6 for application through keyboard 12 to an encoder to transmit to the large-scale integrated circuit 22 the "order" represented by said actuated key.

Figure 13:
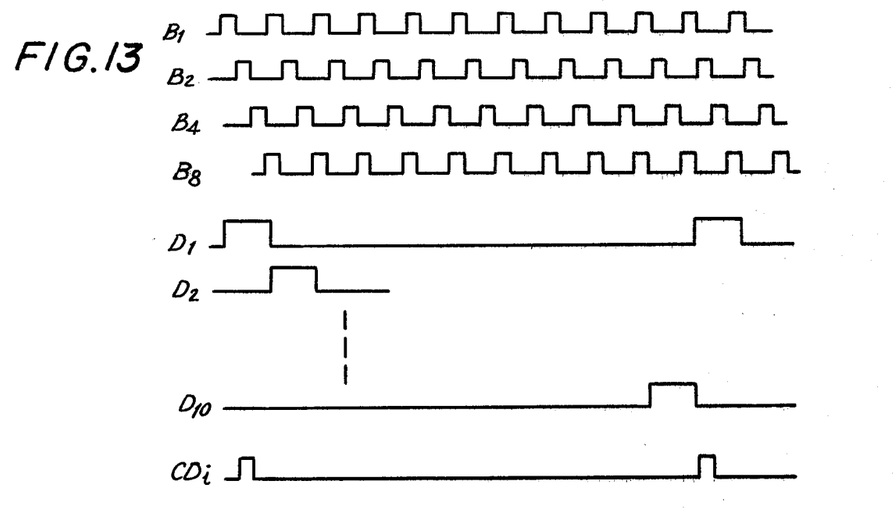
FIG. 13 is a waveform diagram depicting the waveforms associated with the calculator circuit in accordance with the invention.
Figure 14:
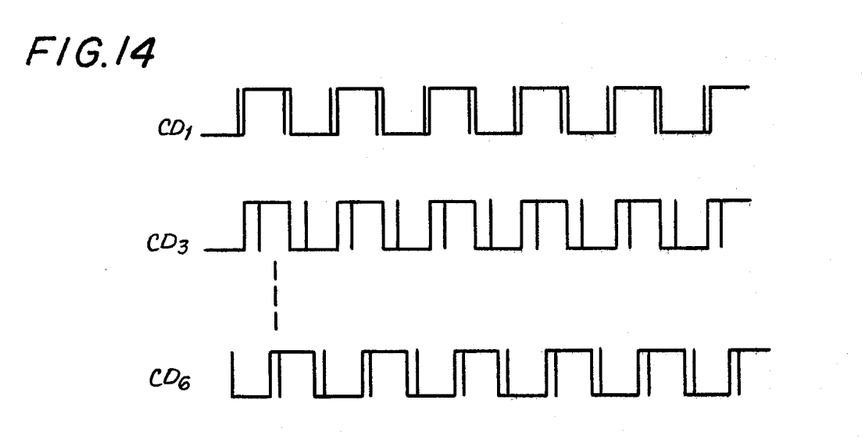
FIG. 14 is a waveform diagram depicting still further waveforms associated with an embodiment of the calculator circuit in accordance with the invention.

In the embodiment represented by the waveforms of FIGS. 13 and 14, the segment driving wires are rendered distinguishable at all times while the display quality is not impaired. Referring first to FIG. 13, waveforms $B_1$, $B_2$, $B_4$ and $B_8$ represent timing pulses by which a decimal system is represented in the 1 - 2 - 4 - 8 binary code. Signals $D_1$, $D_2$, . . . , $D_{10}$ are decimal pulses as described above. Forty possible types of pulses can be obtained by combining signals $B_1$, $B_2$, $B_4$ and $B_8$ with signals $D_1$, $D_2$, . . . , $D_{10}$. In FIG. 13, signal $CD_i$ represents one of the pulses selected from the forty possible pulses thus created. The pulses thus created can be of relatively short duration and can be combined with segment driving pulses as reflected in FIG. 14, showing segment driving pulses combined with the first, third and sixth of the possible $CD_i$ pulses of FIG. 13. The pulses of signal $CD_i$ have a duty factor such that the display quality cannot be influenced thereby.

The selected pulse row $CD_i$ can be applied to the selected driving wires 6 by replacing gate block in FIG. 10 with an EXCLUSIVE OR gate. During this time, flip-flop 26 is reset so that there is no output at terminal 28 thereof. By the provision of suitable gating circuitry in FIGS. 10 and 12, the various signals of FIGS. 13 and 14 can be combined and applied to the circuits of FIGS. 10 and 12.

Figure 15:
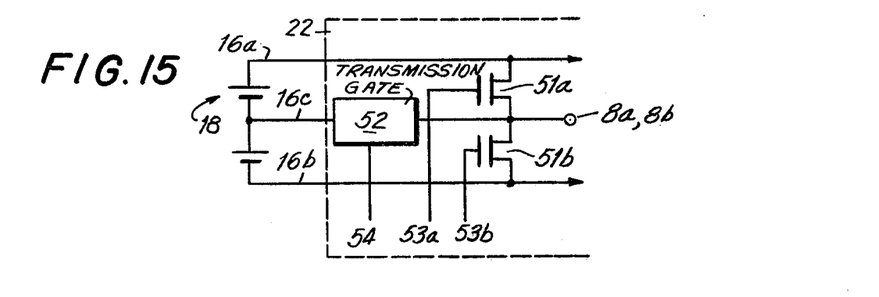
FIG. 15 is a circuit diagram of the circuit for generating the driving signal applied to the common electrodes of the display cell in accordance with the invention.
Figure 16A:
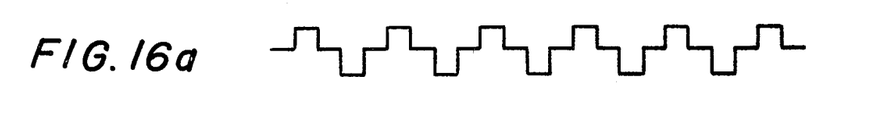
FIGS. 16a, 16b, 16c and 16d are waveform diagrams of the inputs and outputs to the circuit of FIG. 15.
Figure 16B:
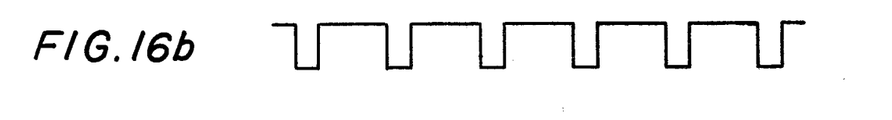
Figure 16C:
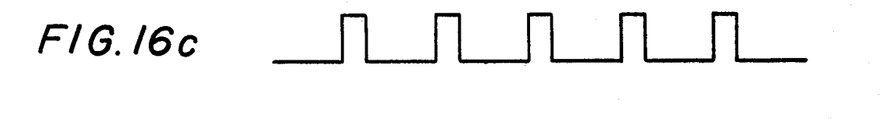
Figure 16D:
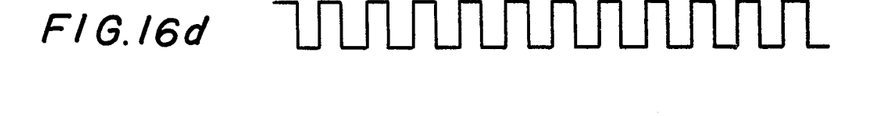

The arrangement for generating the driving signals applied to common electrode wires 8a and 8b is explained in connection with FIGS. 15, 16a, 16b, 16c and 16d. Referring to FIG. 15, a pair of MOS transistors 51a and 51b are connected with their source-drain paths in series. Transistor 51a is characterized by a polarity such that said transistor becomes conductive at troughs of signal 16b while the transistor 51b is characterized by a polarity such that it becomes conductive at crests of signal 16c. The respective gates of transistors 51a and 51b are connected to control electrode terminals 53a and 53b. Transmission gate 52 connects the intermediate voltage of power source 18 to the commonly-connected output terminals of transistors 51a and 51b at crests of signal 16d which is applied to control terminal 54 of said transmission gates. Signals 16c and 16d are applied to control terminals 53a and 53b respectively. In this manner, the common electrode signal 16a is produced at output terminal 8a, 8b.

Figure 17:
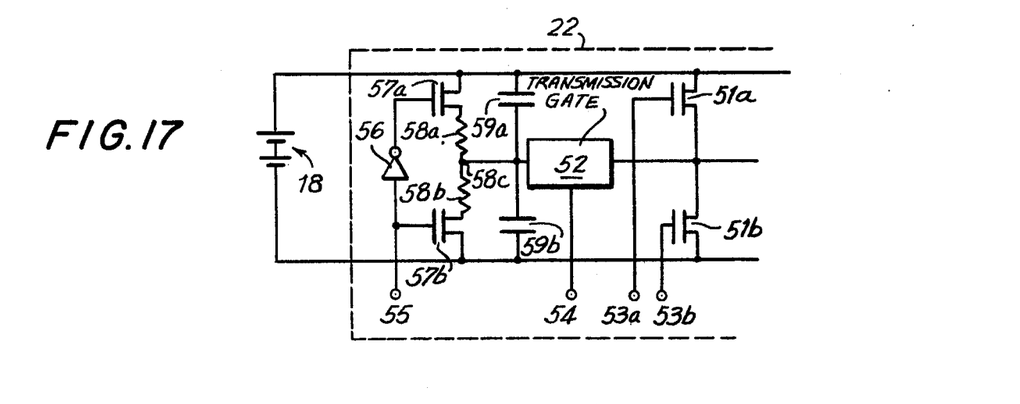
FIG. 17 is a circuit diagram of a further embodiment of the driving-signal generating circuit in accordance with the invention, wherein only two output terminals of the large-scale integrated circuit are connected to the power source.

In FIG. 15, the power supply method utilizes three wires. There are instances where power sources characterized by four of five wires are required, the three-wire approach being adopted for simplicity of explanation. As noted above, it is frequently desirable to eliminate the external center tap from power source 18 and to provide the center tap within the large-scale integrated circuit 22. In the circuit of FIG. 17, pulse input terminal 55 has, applied thereto, pulses having a duty factor of, for example, about 1/20 or 1/100. This signal is applied directly to the gate of transistor 57b and through inverter 56 to the gate of transistor 57a. The respective source-drain paths of transistors 57a and 57b are connected in series with resistances 58a and 58b which are connected in series through point 58c. The respective resistance values 58a and 58b are essentially equal and are formed internal to the large-scale integrated circuit 22. A capacitor 59a is connected in parallel with the series connection of the source-drain path of transistor 57a and resistor 58a while a capacitor 59b is connected is parallel with the series connection of the source-drain path of transistor 57b and resistor 58b. Capacitors 59a and 59b may be formed from the parasitic capacitance within the large-scale integrated circuit and are provided for storing potential during the period that transistors 57a and 57b are non-conductive. The potential at point 58c represents an intermediate potential of power source 18. The balance of the circuit of FIG. 17 substantially corresponds to the circuit of FIG. 15.

While the intermediate potential can be formed solely from a voltage divider defined by resistances 58a and 58b, the transistors 57a and 57b are provided to minimize the area required for the resistances since high resistance requires a large area. If, by way of example, resistance 58a is selected to be 10 K ohms and the conductive duly factor of transistor 57a is set to be 1/20, the equivalent resistance becomes 10 K ohms × 20 = 200 K ohms. The resistance value then becomes 200 K ohms + 200 K ohms = 400 K ohms as seen by the power source and power consumption in the circuit of FIG. 17 can be decreased to a negligible level. Seen from connection point 58c, the resistances, each value of which is 200 K ohms, are disposed in parallel so that the net resistance value is 100 K ohms. Since the liquid crystal is merely a capacitance load, the driving impedance may be from 100 K ohms to 1 M ohms. As noted above, the parasitic capacitance of the large-scale integrated circuit 22 may be utilized or separate capacitors may be formed therein.

Still other approaches for eliminating an input power source terminal in the large-scale integrated circuit may be utilized. For example, by rectifying a pulse signal of a higher voltage by a rectifier formed from a diode and capacitor, lower voltages can be produced using circuitry within the large-scale integrated circuit. In this manner, while the power source is connected to two terminals in the large-scale integrated circuit, any number of internal voltage levels can be achieved utilizing the techniques described above.

By the arrangement described above, the calculator incorporating a display formed from electro-optically passive elements can be produced at a reasonable price. Display cells formed of passive elements can have a duty factor of one-half, one-third or one-quarter. In many cases, the input and output terminals of the large-scale integrated circuit can be further decreased in number. The decreased input and output terminals can be replaced by an increase in digits or function numbers. The large-scale integrated circuit may be formed from P-channel or N-channel MOS transistors, Enhanced Depletion (ED) transistors or Complementary - MOS (C-MOS) transistors. Especially where C-MOS transistors are utilized, a portable calculator having extremely low power consumption on the order of 100$\mu$W or less may be formed.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings, shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. An electronic calculator comprising multi-digit display-cell means, each of said digits of display being defined, at least in part, by a plurality of segment electrodes and a passive display material, regions of said passive display material being rendered visible by selective application of driving signals to selected of said segment electrodes; a large-scale integrated circuit means for producing said display-driving signals; a plurality of display-driving lines operatively coupling said large-scale integrated circuit means and said segment electrodes for transmitting said display-driving signals thereto; and keyboard means having a plurality of keys, an output operatively coupled between said plurality of keys and said large-scale integrated circuit means and a plurality of inputs, each corresponding to one of said keys and respectively connected to one of a corresponding selected plurality of said display-driving lines, said large-scale integrated circuit means including calculator circuit means for receiving information-bearing signals from the output of said keyboard means and for producing said display-driving signals, and keyboard-actuation circuit means for applying keyboard input signals to said selected plurality of display-driving lines for application to said keyboard means in response to the detection of the actuation of said keyboard from said keyboard means output, each of said keyboard input signals being different from the other, at least a selected one of said keyboard input signals being transmitted by said keyboard means by the actuation of one key of said keyboard through the output thereof, said keyboard-actuation circuit means being adapted to detect a display-driving signal at the keyboard means output in response to the initial actuation of said keyboard means and in response to detection of said display-driving signal, to cut off the application of display-driving signals to said selected display-driving lines during the period that said keyboard input signals are applied to said display-driving lines.

2. The calculator as recited in claim 1, wherein said calculator circuit means includes first circuit means coupled to said keyboard means output for transmitting an operation signal representative of the state of the keyboard, said first circuit means being operatively coupled to said keyboard-actuation circuit means and adapted to be disabled by a signal from said keyboard-actuation circuit means during the period that said keyboard input signals are applied to said display-driving lines.

3. The calculator as recited in claim 2, wherein said keyboard-actuation means includes flip-flop means adapted to be set in response to the initial detection of the actuation of said keyboard means to produce an output signal for disabling said first circuit means and delay circuit means for resetting said flip-flop after a predetermined period of time.

4. The calculator as recited in claim 1, wherein said keyboard input signals each consist of a pulse signal out of phase with the pulse signal of the other of said keyboard input signals.

5. The calculator as recited in claim 1, wherein said keyboard input signals each consist of a pulse of short duration relative to said display-driving signals.

6. The calculator as recited in claim 1, wherein said calculator means includes second circuit means for superimposing a detection signal on the display-driving signals applied to said selected plurality of said display-driving lines, said detection signal being of a higher frequency and of substantially shorter pulse width than the display-driving signals, said keyboard-actuation circuit means being adapted to detect said detection signal at the keyboard means output in response to the initial actuation of said keyboard means and in response to detection of said display-driving signal, to cut off the application of display-driving signals to said selected display-driving lines during the period that said keyboard input signals are applied to said display-driving lines.

7. The calculator as recited in claim 1, wherein said calculator circuit means includes second circuit means for superimposing a detection signal on the display-driving signals applied to said selected plurality of said display-driving lines; said keyboard means output being coupled to said large-scale integrated circuit means through other of said display-driving lines than the display-driving lines coupled to said keyboard inputs; said keyboard-actuation means being adapted to detect said detection signal at said other display-driving lines in response to the initial actuation of said keyboard means and in response to detection of said display-driving signal, to cut off the application of display-driving signals to said plurality of selected display-driving lines and said other display-driving lines during the period that said keyboard input signals are applied to said display-driving lines.

8. The calculator as recited in claim 1, wherein said keyboard means includes at least one further output and at least a further plurality of keys, said further output being operatively coupled between said further plurality of keys and said large-scale integrated circuit means, each of the keys of said further plurality of keys corresponding to one of said plurality of inputs, said calculator circuit means and keyboard-actuation circuit means being responsive to both said first-mentioned and said further keyboard means outputs.

* * * * *